United States Patent
Aziz et al.

(10) Patent No.: US 6,811,896 B2
(45) Date of Patent: Nov. 2, 2004

(54) ORGANIC LIGHT EMITTING DEVICE (OLED) WITH THICK (100 TO 250 NANOMETERS) PORPHYRIN BUFFER LAYER

(75) Inventors: Hany Aziz, Burlington (CA); Zoran D. Popovic, Mississauga (CA); Nan-Xing Hu, Oakville (CA); Ah-Mee Hor, Mississauga (CA)

(73) Assignee: Xerox Corporation, Stamford, CT (US)

( * ) Notice: Subject to any disclaimer, the term of this patent is extended or adjusted under 35 U.S.C. 154(b) by 7 days.

(21) Appl. No.: 10/208,595

(22) Filed: Jul. 29, 2002

(65) Prior Publication Data

US 2004/0018381 A1 Jan. 29, 2004

(51) Int. Cl.[7] .......................... H05B 33/14; H05B 33/22
(52) U.S. Cl. ....................... 428/690; 428/332; 428/917; 313/504; 313/506
(58) Field of Search ................................. 428/690, 917, 428/332; 313/504, 506

(56) References Cited

U.S. PATENT DOCUMENTS

| 4,356,429 A | 10/1982 | Tang ........................... 313/503 |
| 4,720,432 A | 1/1988 | VanSlyke et al. ............ 428/457 |
| 4,769,292 A | 9/1988 | Tang et al. .................. 428/690 |
| 6,069,442 A * | 5/2000 | Hung et al. .................. 313/504 |
| 6,562,982 B1 * | 5/2003 | Hu et al. ..................... 548/440 |
| 2002/0145380 A1 * | 10/2002 | Aziz et al. ................... 313/504 |

OTHER PUBLICATIONS

Hung et al., "Sputter deposition of cathodes in organic light emitting diodes", Journal of Applied Physics, vol. 86, No. 8, pp. 4607–4612.*

* cited by examiner

*Primary Examiner*—Dawn Garrett
(74) *Attorney, Agent, or Firm*—Eugene O. Palazzo, Esq.; Fay, Sharpe, Fagan, Minnich & McKee, LLP

(57) ABSTRACT

An organic light emitting device (OLED) has a thick (100 to 250 nanometers) porphyrin buffer layer between the anode and the luminescent region. The thick porphyrin buffer layer in the OLED results in a small increase in device operating voltage, reduces the possibility of OLED shorting and can improve color purity in blue emitting OLEDs due to its significant optical absorption in the red range.

14 Claims, 4 Drawing Sheets

ORGANIC LIGHT EMITTING DEVICE (OLED) WITH THICK (100 TO 250 NANOMETERS) PORPHYRIN BUFFER LAYER

BACKGROUND OF THE INVENTION

The present invention relates generally to an organic light emitting device (OLED), and more particularly to a thick (100 to 250 nanometers) porphyrin buffer layer between the anode and the luminescent region of an organic light emitting device (OLED).

Organic light emitting devices (OLEDs) represent a promising technology for display applications. A typical organic light emitting device includes a transparent or a substantially transparent substrate; a transparent or substantially transparent first electrode, which usually acts as a hole-injecting anode; a luminescent region comprising an organic electroluminescent material; and a second electrode, which usually acts as an electron injecting cathode.

When a voltage is applied across the first and second electrodes, electrons are injected from the cathode into the luminescent region and holes are injected from the anode into the luminescent region. The holes and electrons recombine in the luminescent region, which emits light through the anode and through the substrate.

To achieve efficient electroluminescence, some known OLEDs have an organic luminescent region consisting of two or three or four extremely thin layers of less than 1 micron in combined thickness separating the anode and cathode. The layers include a hole transport layer (HTL) adjacent to the anode to inject and transport holes and an electron transport layer (ETL) adjacent to the cathode to inject and transport electrons and sometimes also acting as the light emission zone of the OLED. During operation, an applied electric field causes positive charges (holes) and negative charges (electrons) to be respectively injected from the anode and the cathode to recombine in the luminescent region and thereby produce light emission.

The thin luminescent region offers reduced electrical resistance, permitting higher current densities for a given level of electrical biasing. Since light emission is directly related to current density through the luminescent region, the thin layers coupled with increased charge injection and transport efficiencies have allowed acceptable light emission levels (e.g., brightness levels capable of being visually detected in ambient light) to be achieved for the first time with low applied voltages.

Electroluminescence can be obtained from organic light emitting devices containing mixed layers in the luminescent region, for example, layers in which both the hole transport material and the electron transport material are mixed together in one layer.

In general, the luminescent region between the anode and cathode electrodes of the OLED is very thin organic medium, usually less than 200 nm thick. In order to enable a low OLED operating voltage of less 15 Volts, the total thickness of the organic luminescent region, which may comprise one or more layers, typically two to four layers, has to be minimized to less than 1000 nanometers and preferably less than 200 nanometers.

A thin buffer layer of less than 100 nanometers thickness made of a porphyrin compound such as copper phthalocyanine (CuPc) can be formed between the anode and the hole transport layer (HTL) of the OLED to increase the operational stability of the OLED as taught, for example, in U.S. Pat. Nos. 4,356,429, 4,720,432 and 4,769,292, herein incorporated by reference. In these OLEDs with thin porphyrin buffer layers, the hole transport zone (HTZ) comprises one or more layers of a hole transport layer (HTL), each comprising a hole transport material (HTM) in addition to the buffer layer. Although the inclusion of the thin buffer layer in these devices is necessary for achieving a satisfactory operational stability, such as a half-life amounting to several thousands of hours, the thin buffer layer leads to an inevitable and undesirable increase in OLED operating voltage from three to four Volts higher than an OLED without a buffer layer. A total thickness for the whole organic luminescent region, including the thin porphyrin buffer layer, is suggested to not exceed 1000 nanometers, and preferably, to not exceed 200 nanometers. Smaller thicknesses for the thin buffer layer of less than 40 nanometers are used in these OLEDs, where the smaller thickness, as then believed, was desirable in order to avoid further increases in OLED operating voltage.

Another known problem with OLEDs, in general, is the high susceptibility of the devices to electrical shorting. The reduced thickness of the organic luminescent region is necessary to allow low device operating voltages of less than 15 Volts. Unfortunately the same reduced thickness of the organic luminescent region often results in the formation of pinholes. These pinholes act as electrical shorts between the cathode and anode and eliminate luminescence by the OLED. Although non-conductive polymeric binders can be added, usually as solid solvents, to provide pinhole free layers, and to create a luminescent region of the desired thickness, the binders tend to interfere with the injection of holes and electrons at the electrodes.

It is an object of the present invention to provide a porphyrin buffer layer in an OLED.

SUMMARY OF THE INVENTION

According to the present invention, an organic light emitting diode (OLED) has a thick (100 to 250 nanometers) porphyrin buffer layer between the anode and the luminescent region. The thick porphyrin buffer layer in the OLED results in a smaller increase in device operating voltage, only one to two Volts over that of OLEDs without the buffer layer. The thick porphyrin buffer layer reduces the possibility of OLED shorting. The thick porphyrin buffer layer can improve color purity in blue emitting OLEDs due to its significant optical absorption in the red range.

Other objects and attainments together with a fuller understanding of the invention will become apparent and appreciated by referring to the following description and claims taken in conjunction with the accompanying drawings.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof. In addition, the figures are not drawn to scale for ease of understanding the present invention.

Figure 1:
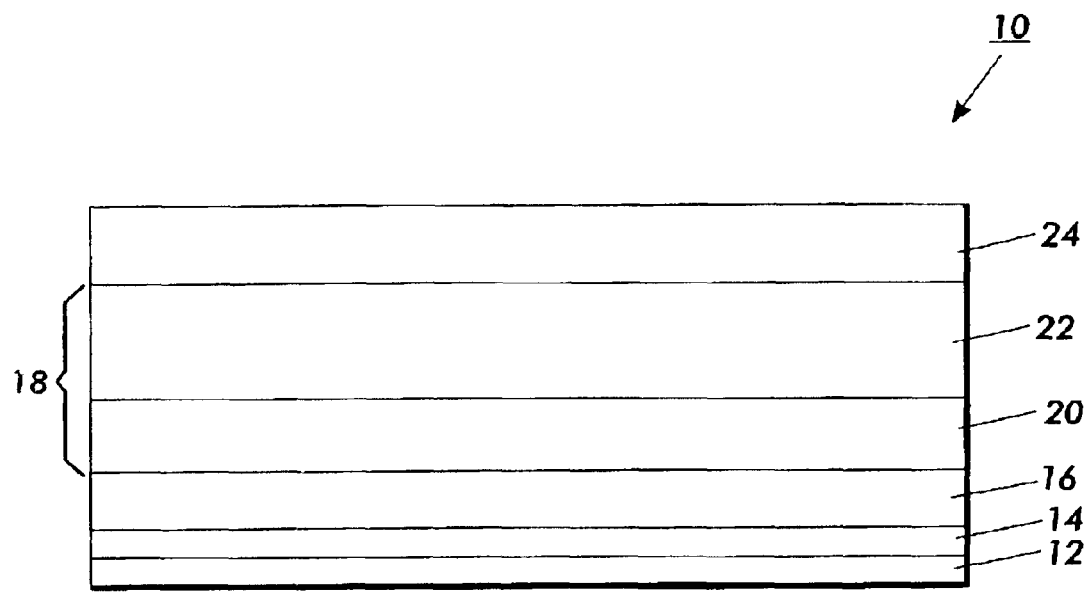
FIG. 1 illustrates an organic light emitting device (OLED) with a thick (100 to 250 nanometers) porphyrin buffer layer in accordance with a first embodiment of the present invention.

Reference is now made to FIG. 1, wherein there is illustrated an organic light emitting device (OLED) 10 with a thick (100 to 250 nanometers) porphyrin buffer layer between the anode and the luminescent region in accordance with this invention.

The OLED 10 has a transparent or substantially transparent substrate 12, such as glass or MYLAR®. A transparent or substantially transparent indium tin oxide (ITO) anode 14 having a thickness of 30 nm is formed on the substrate 12. A transparent or substantially transparent porphyrin buffer layer 16 of copper phthalocyanine (CuPc) having a thickness of between 100 and 250 nanometers is formed on the anode 14. A luminescent region 18 of an organic electroluminescent material is formed on the buffer layer 16. The luminescent region 18 has a naphthyl-substituted benzidine derivative, N,N'-di-1-naphthyl-N,N'-diphenyl-1,1'-biphenyl-1,1'-biphenyl-4,4'-diamine (NPB) hole transport layer 20 having a thickness of 72 nm formed on the buffer layer 16 and a tris(8-hydroxyquinolinate) aluminum ($AlQ_3$) emitting electron transport layer 22 having a thickness of 75 nm formed on the hole transport layer 20. A Mg:Ag (90 percent volume Mg and 10 percent volume Ag) cathode 24 having a thickness of 120 nm is formed on the electron transport layer 22 of the luminescent region 18.

An external power source (not shown in the Figure) will forward bias the anode 14 in relation to the cathode 24. Holes will be injected from the anode 14 through the buffer layer 16, through the hole transport layer 20 of the luminescent region 18 and into the electron transport layer 22 of the luminescent region 18. Concurrently electrons will be injected from the cathode 24 into the electron transport layer 22 of the luminescent region 18. The holes and the electrons will combine and emit light. The light will be emitted from the luminescent region 18 through the transparent buffer layer 16, the transparent anode 14 and the transparent substrate 12. Alternate OLED designs allow the light to be emitted from the edge of the luminescent region 18 or through a transparent cathode 24.

The use of a thicker (100 to 250 nm) porphyrin buffer layer in an OLED unexpectedly results in a small increase in OLED operating voltage of only one to two Volts over that of an OLED without the porphyrin buffer layer. The use of a thinner (less than 100 nm) porphyrin buffer layer in an OLED results in an increase of three to four Volts over that of an OLED without the porphyrin buffer layer. The current-voltage characteristics of a group of OLEDs which all contain a CuPc porphyrin buffer layer at the hole injection anode are given in FIG. 2. The CuPc porphyrin buffer layer has a different thickness in each OLED, but, otherwise, the OLEDs have essentially identical structures: ITO anode 14/CuPc buffer layer 16/NPB hole transport layer 20/$AlQ_3$ emitter and electron transport layer 22/Mg:Ag cathode 24 of OLED 10 in FIG. 1.

Figure 2:
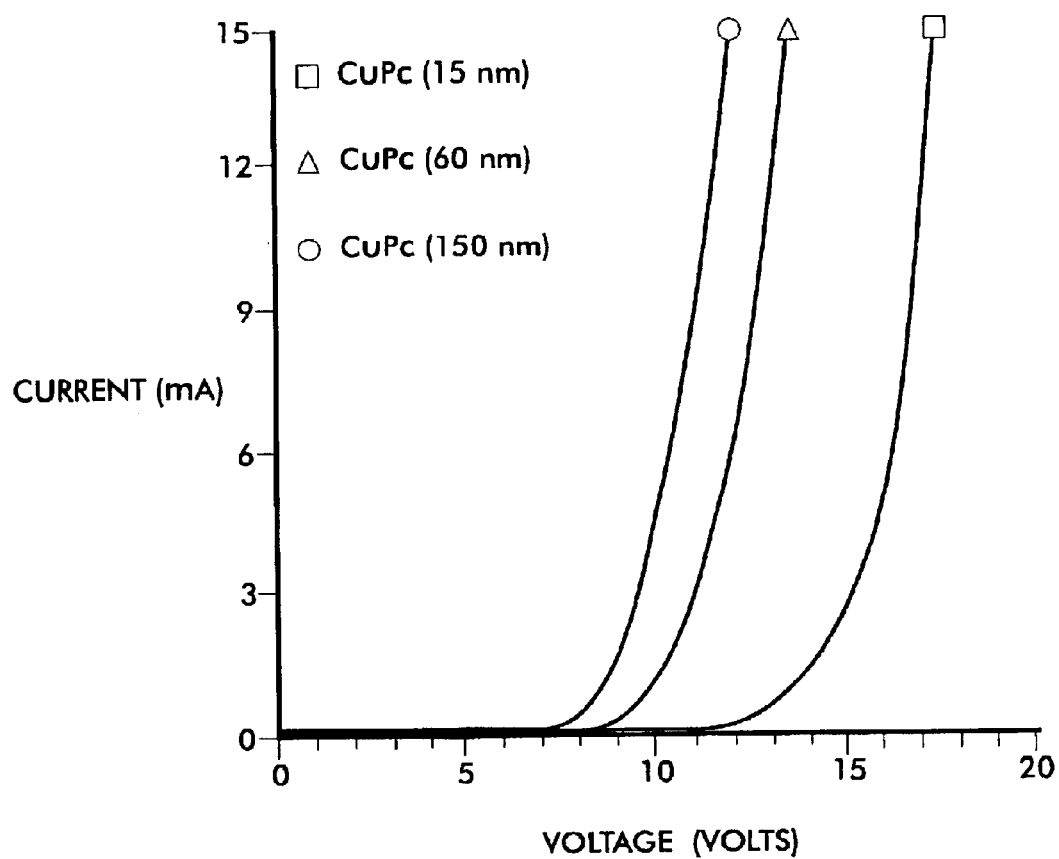
FIG. 2 is a graph of voltage versus current for OLEDs with varying thicknesses of the porphyrin buffer layer.

As shown in FIG. 2, the current-voltage characteristics of the OLED shifts to lower voltages on increasing the thickness of the CuPc porphyrin buffer layer, which translates into a lower operating voltage for the OLED. For example, to drive a current of about 2.5 mA which equals 31.25 $mA/cM^2$ in the OLED containing the 15 nm thick CuPc porphyrin buffer layer, a voltage of about 13.8 volts is needed, whereas a voltage of only about 8.8 volts is needed to drive the same current in the OLED containing the 150 nm thick CuPc porphyrin buffer layer. Obviously, a lower OLED operating voltage is more desirable for lower energy consumption. The shift in the current-voltage characteristics to lower voltage values indicates increased charge transport in thicker CuPc porphyrin buffer layers over that in thinner CuPc porphyrin buffer layers. The ability of the CuPc porphyrin buffer layer to attain a different morphology on increasing the thickness of the buffer layer may lead to the improved charge conduction through the OLED.

Figure 3:
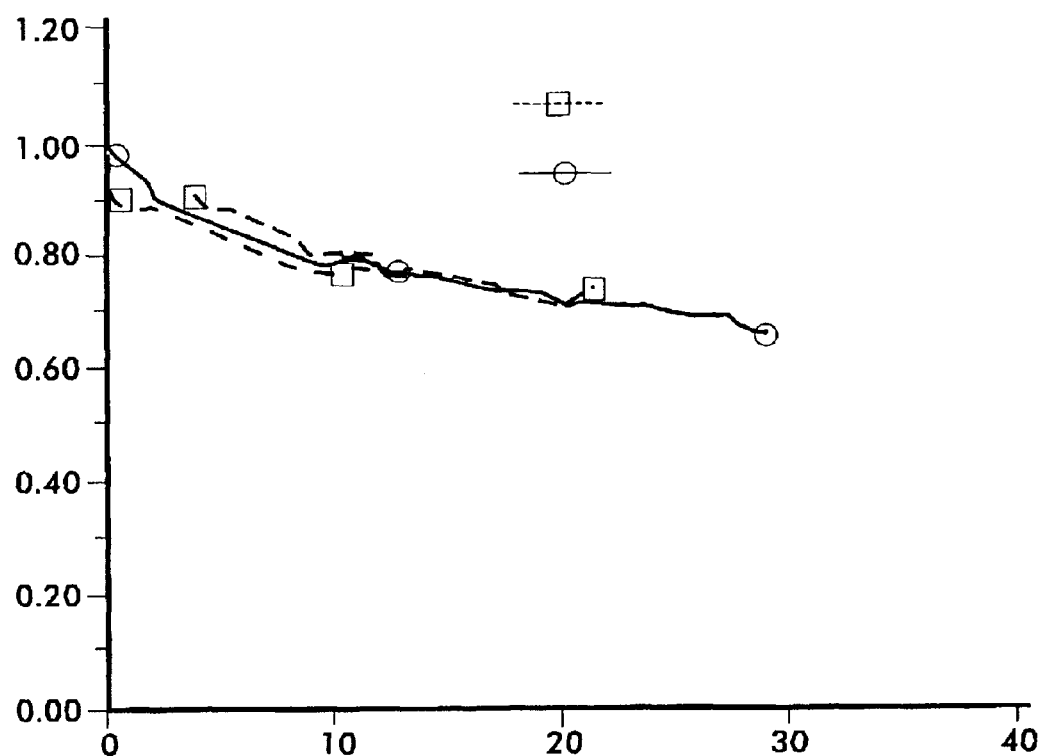
FIG. 3 is a graph of operational stability of OLEDs with varying thicknesses of the porphyrin buffer layer.

Comparative operational stability tests on OLEDs with thin (15 nm) and thick (150 nm) thick CuPc porphyrin buffer layers, operated under the same accelerated testing conditions (AC driving, 31.25 $mA/cm^2$) are shown in FIG. 3. The results are presented in the form of normalized luminance (luminance (L)/initial luminance (Lo) versus duration (time) of OLED operation.

As seen in FIG. 3, the rate of luminance decay is essentially the same in both OLEDs with thick (150 nm) and thin (15 nm) porphyrin buffer layers, revealing that both OLEDs demonstrate the same operational stability behavior.

The combined results therefore demonstrate that using a thick CuPc porphyrin buffer layer of greater than 100 nm thickness leads to a reduction in the operating voltage of the OLED without an adverse effect on its operational stability.

Furthermore, the use of thick CuPc porphyrin buffer layers reduces the possibility of OLED shorting. The ability of the CuPC porphyrin buffer layer to conform to substrate topography provides a smoother and more planarized surface that prevents, or at least substantially reduces pinhole formation.

Moreover, in case of blue-emitting OLEDs, the thick CuPc porphyrin buffer layer improves color purity due to its significant optical absorption in the red range during light transmission through the porphyrin buffer layer.

Figure 4:
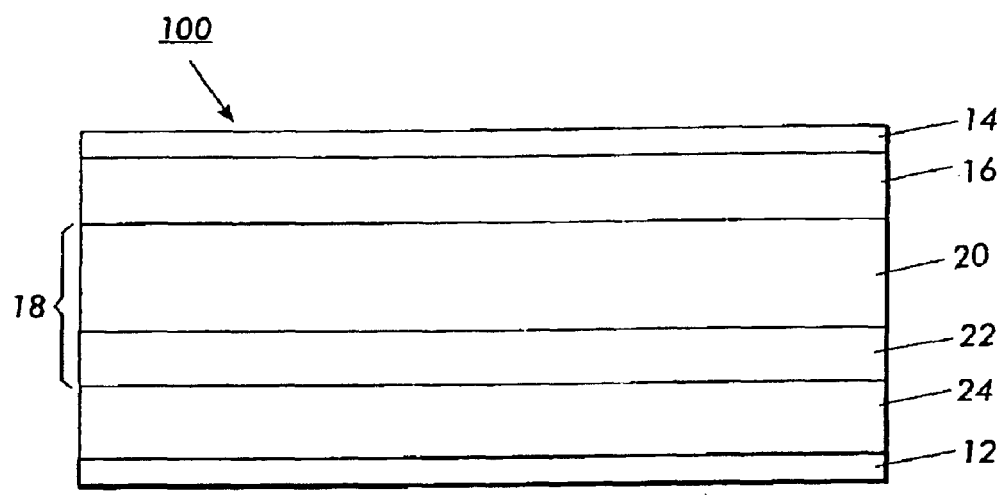
FIG. 4 illustrates an organic light emitting device (OLED) with a thick (100 to 250 nanometers) porphyrin buffer layer in accordance with a second embodiment of the present invention.

Reference is now made to FIG. 4, wherein there is illustrated an organic light emitting device (OLED) 100 with a thick (100 to 250 nanometers) porphyrin buffer layer between the anode and the luminescent region in accordance with a second embodiment of this invention.

The OLED 100 has a substrate 12, such as glass or MYLAR®. A Mg:Ag (90 percent volume Mg and 10 percent volume Ag) cathode 24 having a thickness of 120 nm is formed on the substrate 12. A luminescent region 18 of an organic electroluminescent material is formed on the cathode 24. The luminescent region 18 has a tris(8-hydroxyquinolinate) aluminum ($AlQ_3$) emitting electron transport layer 22 having a thickness of 75 nm formed on the cathode 24 and anaphtyl-substituted benzidine derivative, N,N'-di-1-naphthyl-N,N'-diphenyl-1,1'-biphenyl-1,1'-biphenyl-4,4'-diamine (NPB) hole transport layer 20 having a thickness of 72 nm formed on the electron transport layer 22. A porphyrin buffer layer 16 of copper phthalocyanine (CuPc) having a thickness of between 100 and 250 nanometers is formed on the hole transport layer 20 of the luminescent region 18. An indium tin oxide (ITO) anode 14 having a thickness of 30 nm is formed on the buffer layer 16.

An external power source (not shown in the Figure) will forward bias the anode 14 in relation to the cathode 24. Holes will be injected from the anode 14 through the buffer layer 16, through the hole transport layer 20 of the luminescent region 18 and into the electron transport layer 22 of the luminescent region 18. Concurrently electrons will be injected from the cathode 24 into the electron transport layer 22 of the luminescent region 18. The holes and the electrons will combine and emit light. The light will be emitted from the luminescent region 18 either through a transparent cathode 24 and a transparent substrate 12 or through a transparent buffer layer and a transparent anode 14 or from the edge of the luminescent region 18.

A porphyrin for the buffer layer is any compound, natural or synthetic, which is derived from or includes a porphyrin structure, including porphine itself. Any of the porphyrin compounds disclosed by U.S. Pat. Nos. 3,935,031, 4,356,429, or 4,720,432, the disclosures of which are here incorporated by reference, can be employed for the thick (100 nanometer to 250 nanometer) buffer layer. Highly preferred examples of useful porphyrin compounds are metal free phthalocyanines and metal containing phthalocyanines. While porphyrin compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum. Illustrative of useful porphyrin compounds are the following: porphine; 1,10,15,20-tetraphenyl-21h,23h-porphine copper (ii); 1,10,15,20-tetraphenyl-21h,23h-porphine zinc (ii); 5,10,15,20-tetrakis(pentafluorophenyl)-21h,23h-porphine; silicon phthalocyanine oxide; aluminum phthalocyanine chloride; phthalocyanine (metal free); dilithium phthalocyanine; copper tetramethylphthalocyanine; chromium phthalocyanine fluoride; zinc phthalocyanine; lead phthalocyanine; titanium phthalocyanine oxide; magnesium phthalocyanine; or copper octamethylphthalocyanine.

The substrate 12 can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Mixtures of these various materials can also be used. Other substrate materials can also be selected provided, for example, that the materials can effectively support the other layers, and do not interfere with the device functional performance. Preferably, in embodiments, the substrate is formed of a light transmission material.

The thickness of the substrate 12 is not particularly limited except by the structural demands of the organic light emitting device and its intended use. Suitable thicknesses include, for example, from about 25 $\mu$m to at least about 1,000 $\mu$m.

In the organic light emitting device 10, the anode 14 can comprise suitable positive charge injecting electrodes such as indium tin oxide (ITO), tin oxide, gold and platinum. Other suitable materials for forming the anode include, but are not limited to, electrically conductive carbon, π-conjugated polymers such as polyaniline, polythiophene, polypyrrole, and the like having, for example, a work function equal to, or greater than, about 4 eV, and preferably from about 4 eV to about 6 eV.

The anode 14 can have any suitable form. A thin conductive layer can be coated onto a tight transmissive substrate, such as, for example, a transparent or substantially transparent glass plate or plastic film. Embodiments of organic light emitting devices can comprise a light transmissive anode formed from tin oxide or indium tin oxide coated on glass. Also, very thin light-transparent metallic anodes having a thickness, for example, of less than about 200 Å, and, preferably, from about 75 Å to about 150 Å can be used. These thin anodes can comprise metals such as gold, palladium and the like. In addition, transparent or semi-transparent thin layers of conductive carbon or conjugated polymers such as polyaniline, polythiophene, polypyrrole and the like can be used to form anodes. These thin layers can have a thickness of, for example from 50 Å to about 175 Å.

The thickness of the anode 14 can range from about 1 nm to about 5000 nm. The preferred thickness range of the anode is dependent on the optical constants of the anode material. One preferred thickness range of the anode is from about 30 nm to about 300 nm. Although less preferred, thicknesses outside of this range can also be used.

The luminescent region 18 of the light emitting device 10 comprises at least one layer of electroluminescent organic material. Suitable organic electroluminescent materials include, for example, polyphenylenevinylenes, such as poly (p-phenylenevinylene) PPV, poly(2-methoxy-5-(2-ethylhexyloxy) 1,4-phenylenevinylene) MEHPPV and poly (2,5-dialkoxyphenylenevinylene) PDMeOPV, and other materials disclosed in U.S. Pat. No. 5,247,190, which is incorporated herein by reference in its entirety; polyphenylenes, such as poly(p-phenylene) PPP, ladder-poly-para-phenylene (LPPP), and poly(tetrahydropyrene) PTHP; and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers.

Another class of organic electroluminescent materials that can be utilized in the luminescent region 18 includes, but is not limited to, the metal oxinoid compounds. Illustrative examples include tris(8-hydroxyquinolinate) aluminum (AlQ3), which is one preferred example, and bis(8-hydroxyquinolato)-(4-phenylphenolato) aluminum (BAlq) which is another preferred example. Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds, such as metal thioxinoid compounds of bis(8-quinolinethiolato)zinc, bis(8-quinolinethiolato)cadmium, tris(8-quinolinethiolato) gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo {f}-8-quinolinethiolato]zinc, bis[3,7-dimethylbenzo{f}-8-quinotinethiolato]zinc, and the like. Preferred materials are bis(8-quinolinethiolato)zinc, bis(8-quinolinethiolato) cadmium, tris(8-quinolinethiolato)gallium, tris(8-quinolinethiolato)indium and bis[benzo{f}-8-quinolinethiolato]zinc.

Yet another class of organic electroluminescent materials that can be used in the luminescent region 18 comprises stilbene derivatives. A preferred stilbene derivative is 4,4'-bis(2,2-diphenylvinyl)biphenyl.

Another class of suitable organic electroluminescent materials suitable for utilizing in the luminescent region 18 is the oxadiazole metal chelates. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like; and the triazines.

The luminescent region 18 can further include from about 0.01 weight percent to about 25 weight percent of a luminescent material as a dopant. Examples of dopant materials that can be utilized in the luminescent region 18 are fluorescent materials, such as, for example, coumarin, dicyanomethylene pyranes, polymethine, oxabenzanthrane, xanthene, pyrylium, carbostyl, perylene, and the like. Another preferred class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like. Another class of fluorescent materials that may be used is fused ring fluorescent dyes. Exemplary suitable fused ring fluorescent dyes include perylene, rubrene, anthracene, coronene, phenanthrecene, pyrene and the like. Also, fluorescent materials include butadienes, such as 1,4-diphenylbutadiene and tetraphenylbutadiene, and stilbenes, and the like.

Additionally, luminescent dopants that can be utilized in the light luminescent region 18 are the fluorescent dyes, such as, for example, 4-(dicyanomethylene)-2-I-propyl-6-(1,1,7,7-tetramethyljulolidyl-9-enyl)-4H-pyran (DCJTB); the lanthanide metal chelate complexes, such as for example, tris(acetylacetonato)(phenanthroline) terbium, tris(acetyl acetonato)(phenanthroline) europium, and tris(thenoyl trisfluoroacetonato)(phenanthroline) europium; and phosphorescent materials, such as, for example, organometallic compounds containing heavy metal atoms that lead to strong spin-orbit coupling. Preferred examples include 2,3,7,8,12,13,17,18-octaethyl-21H23H-phorpine platinum(II) (PtOEP) and fac tris(2-phenylpyridine)iridium (Ir(ppy)$_3$).

The luminescent region 18 can have two layers; a hole transport layer 20 and an electron transport layer 22.

The luminescent region 18 can also include one or more materials with hole-transporting properties. Examples of hole-transporting materials that can be utilized in the hole transport layer 20 of the luminescent region 18 include polypyrrole, polyaniline, poly(phenylene vinylene), polythiophene, polyarylamine, and their derivatives, and known semiconductive organic materials; porphyrin derivatives such as 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like.

A specific class of hole transporting materials that can be utilized in the hole transport layer 20 of the luminescent region 18 are the aromatic tertiary amines. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine,b N,N'-di-1-naphthyl-N,N'-diphenyl-1,1'-biphenyl-4,4'-diamine, mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the hole transport layer 20 of the luminescent region 18 are the indolo-carabazoles, such as, for example, 5,11-di-naphthyl-5,11-dihydroindolo[3,2-b]carbazole, and 2,8-dimethyl-5,11-dinaphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N;-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3- methoxyphenyl)-N,N'-diphenyl-1,1'-biphenyl-4,4'-diamine, and the like. Preferred hole transporting materials that can be used in the hole transport layer 20 of the luminescent region 16 are the naphtyl-substituted benzidine derivatives.

The luminescent region 18 can also include one or more materials with electron transporting properties. An example of electron transporting materials that can be utilized in the electron transport layer 22 of the luminescent region 18 is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers.

Other examples of electron transporting materials that can be utilized in the electron transport layer 22 of the luminescent region 18 can be selected from the metal oxinoid compounds, the oxadiazole metal chelate compounds, the triazine compounds and the stilbene compounds, examples of which have been described above in detail.

In embodiments where the luminescent region 18 includes one or more hole transport material and/or one or more electron transport material in addition to the organic electroluminescent material(s), the organic electroluminescent material, the hole transport material(s), and/or the electron transport material(s) can be formed in separate regions; or in the same region thus forming mixed regions of two or more materials.

The thickness of the luminescent region 18 can vary from for example, about 1 nm to about 1000 nm, typically from about 20 nm to about 200 nm, and preferably from about 50 nm to about 150 nm.

The cathode 24 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0. 1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals.

The Mg-Ag alloy cathodes are preferred cathode materials for forming the cathode 24. Other preferred cathodes are formed from lithium alloys with other high work function metals such as aluminum and indium.

The cathode 24 can also include an electron injection layer in contact with the electron transport layer 22 made of an insulative material such as an oxide material or an alkaline metal compound.

The thickness of the cathode 24 can range from, for example, about 10 nm to about 500 nm. Of course, thicknesses outside of this range can also be used.

Electroluminescent devices including buffer layers according to this invention can be used in various types of image forming devices or display applications, such as, for example, flat panel displays. Such applications can be used in a wide range of products, such as, for example, displays for televisions and computers, instrument displays, displays for automotive and aviation applications, and hand-held electronic devices, such as, for example, cellular phones, etc.

While the invention has been described in conjunction with the specific embodiments described above, it is evident that many alternatives, modifications and variations are apparent to those skilled in the art. Accordingly, embodiments of the invention as set forth above are intended to be illustrative and not limiting. Various changes can be made without departing from the spirit and scope of the invention.

What is claimed is:

1. An organic light emitting device comprising:
   a substrate;
   an anode on said substrate; a porphyrin buffer layer on said anode, said porphyrin buffer layer having thickness between 100 nanometers and 250 nanometers;
   a luminescent region on said porphyrin buffer layer comprising an organic electroluminescent material; and
   a cathode on said luminescent region, such that biasing said cathode and said anode causes light emission from said luminescent region, wherein said luminescent region composes a hole transport layer of a hole transport material adjacent to said porphyrin buffer layer, an electron transport layer of an electron transport material adjacent to said cathode, and a light emitting layer of an organic light emitting material interposed between said hole transport layer and said electron transport layer.

2. The organic light emitting device of claim 1 wherein said porphyrin buffer layer is copper phthalocyanine.

3. The organic light emitting device of claim 1 wherein at least one of said hole transport layer and said electron transport layer emits light.

4. The organic light emitting device of claim 3 wherein said porphyrin buffer layer is copper phthalocyanine.

5. An organic light emitting device comprising:
   a substrate;
   an anode on said substrate;
   a porphyrin buffer layer on said anode, said porphyrin buffer layer having a thickness between 100 nanometers and 250 nanometers;
   a luminescent region on said porphyrin buffer layer comprising an organic electroluminescent material; and
   a cathode on said luminescent region, such that biasing said cathode and said anode causes light emission from said luminescent region, wherein said luminescent region comprises a mixed region including a mixture of a hole transport material and an electron transport material.

6. The organic light emitting device of claim 5 wherein said porphyrin buffer layer is copper phthalocyanine.

7. A display device comprising:
   a substrate;
   an anode on said substrate;
   a porphyrin buffer layer on said anode, said porphyrin buffer layer having thickness between 100 nanometers and 250 nanometers;
   a luminescent region on said porphyrin buffer layer comprising an organic electroluminescent material; and
   a cathode on said luminescent region, such that biasing said cathode and said anode causes light emission from said luminescent region, wherein the luminescent region comprises either i) a hole transport layer of a hole transport material adjacent to said porphyrin buffer layer, an electron transport layer of an electron transport material, adjacent said cathode, and a light emitting layer of an organic light emitting material interposed between said hole transport layer and said electron transport layer, or ii) a mixed region including a mixture of a hole transport material and an electron transport material.

8. The display device of claim 7 wherein said porphyrin buffer layer is copper phthalocyanine.

9. An organic light emitting device comprising:

a substrate;

a cathode on said substrate;

a luminescent region on said cathode comprising an organic electroluminescent material;

a porphyrin buffer layer on said luminescent region, said porphyrin buffer layer having thickness between 100 nanometers and 250 nanometers; and an anode on said porphyrin buffer layer, such that biasing said cathode and said anode causes light emission from said luminescent region, wherein said luminescent region comprises an electron transport layer of an electron transport material adjacent to said cathode, a hole transport layer of a hole transport material adjacent to said porphyrin buffer layer, and a light emitting layer of an organic light emitting material interposed between said hole transport layer and said electron transport layer.

10. The organic light emitting device of claim 9 wherein said porphyrin buffer layer is copper phthalocyanine.

11. The organic light emitting device of claim 9 wherein at least one of said electron transport layer and said hole transport layer emits light.

12. The organic light emitting device of claim 11 wherein said porphyrin buffer layer is copper phthalocyanine.

13. An organic light emitting device comprising:

a substrate:

a cathode on said substrate;

a luminescent region on said cathode comprising an organic electroluminescent material;

a porphyrin buffer layer on said luminescent region, said porphyrin buffer layer having thickness between 100 nanometers and 250 nanometers; and an anode on said porphyrin buffer layer, such that biasing said cathode and said anode causes light emission from said luminescent region, wherein said luminescent region comprises a mixed region including a mixture of a hole transport material and an electron transport material.

14. The organic light emitting device of claim 13 wherein said porphyrin buffer layer is copper phthalocyanine.

* * * * *